(12) United States Patent <span>(10) Patent No.: US 12,324,224 B2</span>
Chen et al. <span>(45) Date of Patent: *Jun. 3, 2025</span>

(54) METHOD OF FABRICATING FIN-TYPE FIELD-EFFECT TRANSISTOR DEVICE HAVING SUBSTRATE WITH HEAVY DOPED AND LIGHT DOPED REGIONS

(71) Applicant: Taiwan Semiconductor Manufacturing Company, Ltd., Hsinchu (TW)

(72) Inventors: Chun-Hung Chen, Hsinchu (TW); Chih-Hung Hsieh, Hsin-Chu (TW); Jhon Jhy Liaw, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/335,065

(22) Filed: Jun. 14, 2023

(65) Prior Publication Data

US 2023/0326803 A1    Oct. 12, 2023

Related U.S. Application Data

(63) Continuation of application No. 17/535,712, filed on Nov. 26, 2021, now Pat. No. 11,721,589, which is a (Continued)

(51) Int. Cl.
*H01L 21/8234* (2006.01)
*H01L 21/762* (2006.01)
(Continued)

(52) U.S. Cl.
CPC ..... *H10D 84/038* (2025.01); *H01L 21/76224* (2013.01); *H10B 10/12* (2023.02);
(Continued)

(58) Field of Classification Search
None
See application file for complete search history.

(56) References Cited

U.S. PATENT DOCUMENTS 8,836,016 B2    9/2014    Wu et al.
8,841,701 B2    9/2014    Lin et al.
(Continued)

*Primary Examiner* — Daniel Whalen
(74) *Attorney, Agent, or Firm* — HAYNES AND BOONE, LLP

(57) ABSTRACT

A fin-type field-effect transistor device includes a substrate, insulators, gate stacks and dielectric strips. The substrate includes a first doped region, a second doped region, third doped blocks located above the first doped region and fourth doped blocks located above the second doped region, and fins located above the third doped blocks and the fourth doped blocks, wherein doping concentrations of the third doped blocks are lower than a doping concentration of the first doped region, and doping concentrations of the fourth doped blocks are lower than a doping concentration of the second doped region. The insulators are disposed on the third doped blocks and the fourth doped blocks of the substrate and covering the fins. The dielectric strips are disposed in between the fins, and in between the third doped blocks and the fourth doped blocks. The gate stacks are disposed over the fins and above the insulators.

20 Claims, 16 Drawing Sheets

Related U.S. Application Data continuation of application No. 16/824,655, filed on Mar. 19, 2020, now Pat. No. 11,195,760, which is a continuation of application No. 16/147,896, filed on Oct. 1, 2018, now Pat. No. 10,629,490.

(60) Provisional application No. 62/712,212, filed on Jul. 31, 2018.

(51) Int. Cl.

| | |
|---|---|
| *H01L 27/088* | (2006.01) |
| *H10B 10/00* | (2023.01) |
| *H10D 30/62* | (2025.01) |
| *H10D 30/69* | (2025.01) |
| *H10D 62/00* | (2025.01) |
| *H10D 62/10* | (2025.01) |
| *H10D 62/17* | (2025.01) |
| *H10D 62/60* | (2025.01) |
| *H10D 62/822* | (2025.01) |
| *H10D 84/01* | (2025.01) |
| *H10D 84/03* | (2025.01) |
| *H10D 84/83* | (2025.01) |
| *H01L 21/02* | (2006.01) |
| *H01L 21/027* | (2006.01) |
| *H01L 21/306* | (2006.01) |
| *H01L 21/308* | (2006.01) |
| *H01L 21/3105* | (2006.01) |
| *H10D 64/01* | (2025.01) |

(52) U.S. Cl.
CPC ....... *H10D 30/6212* (2025.01); *H10D 30/797* (2025.01); *H10D 62/021* (2025.01); *H10D 62/116* (2025.01); *H10D 62/393* (2025.01); *H10D 62/60* (2025.01); *H10D 62/822* (2025.01); *H10D 84/0128* (2025.01); *H10D 84/0151* (2025.01); *H10D 84/0158* (2025.01); *H10D 84/834* (2025.01); *H01L 21/02057* (2013.01); *H01L 21/02164* (2013.01); *H01L 21/0217* (2013.01); *H01L 21/0223* (2013.01); *H01L 21/02255* (2013.01); *H01L 21/02271* (2013.01); *H01L 21/0257* (2013.01); *H01L 21/0262* (2013.01); *H01L 21/0274* (2013.01); *H01L 21/30604* (2013.01); *H01L 21/3081* (2013.01); *H01L 21/3086* (2013.01); *H01L 21/31053* (2013.01); *H10D 64/017* (2025.01)

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 10,629,490 B2 * | 4/2020 | Chen .................. H01L 29/1095 |
| 2014/0197458 A1 * | 7/2014 | Ching ................. H01L 29/7849 257/192 |
| 2016/0149036 A1 * | 5/2016 | Huang ............. H01L 29/66636 438/283 |
| 2017/0077302 A1 * | 3/2017 | Cheng .............. H01L 29/66795 |
| 2018/0130802 A1 * | 5/2018 | Wang ................ H01L 27/0928 |

* cited by examiner

METHOD OF FABRICATING FIN-TYPE FIELD-EFFECT TRANSISTOR DEVICE HAVING SUBSTRATE WITH HEAVY DOPED AND LIGHT DOPED REGIONS

CROSS-REFERENCE TO RELATED APPLICATION

This application is a continuation application of U.S. application Ser. No. 17/535,712, filed on Nov. 26, 2021, now allowed. The prior application Ser. No. 17/535,712 is a continuation application of U.S. application Ser. No. 16/824,655, filed on Mar. 19, 2020, which is a continuation of U.S. application Ser. No. 16/147,896, filed on Oct. 1, 2018, and claims the priority benefits of U.S. provisional application Ser. No. 62/712,212, filed on Jul. 31, 2018. The entirety of each of the above-mentioned patent applications is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of manufacturing ICs and, for these advances to be realized, similar developments in IC manufacturing are needed. For example, a three-dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
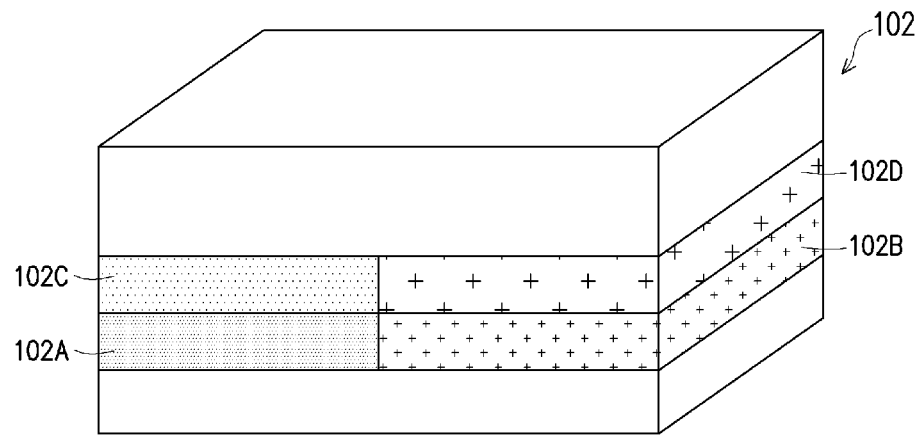
FIG. 1A to FIG. 13B are schematic views and sectional views of a method of forming a FinFET device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1A to FIG. 13B are schematic views and sectional views of a method of fabricating a FinFET device in accordance with some embodiments of the present disclosure. The process of fabricating the FinFET device according to some embodiments will be described in detail below.

Figure 1B:
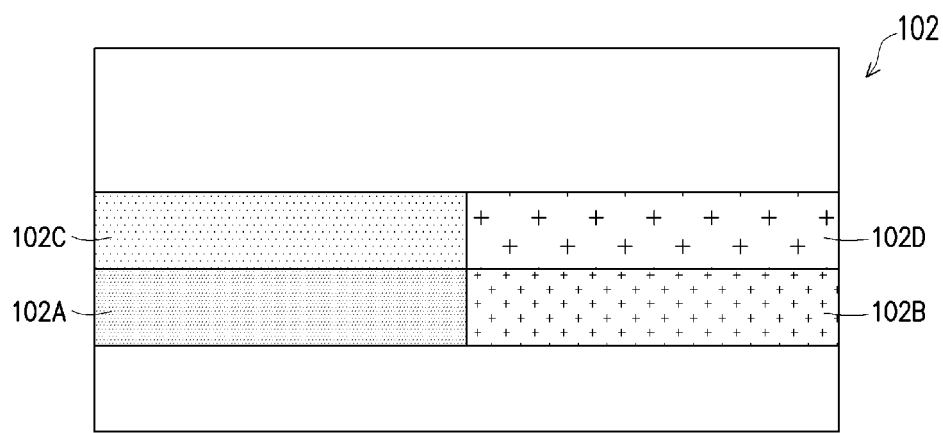

FIG. 1A is one stage in a method of fabricating a FinFET device in accordance with some embodiments of the present disclosure. FIG. 1B is a sectional view of the structure shown in FIG. 1A. Referring to FIG. 1A and FIG. 1B, a substrate 102 is provided. In one embodiment, the substrate 102 includes a silicon substrate, a silicon-on-insulator (SOI) substrate, a silicon germanium substrate, or a suitable semiconductor substrate. Other semiconductor materials including group III, group IV, and group V elements may also be used. The substrate 102 may comprise various doped regions depending on design requirements. For example, in the illustrated embodiment, a first doped region 102A and a second doped region 102B are formed in the substrate 102. The first doped region 102A is located adjacent to the second doped region 102B, and are levelled and planar to each other. In certain embodiments, a third doped region 102C is formed over the first doped region 102A, while a fourth doped region 102D is formed over the second doped region 102B within the substrate 102. The third doped region 102C may be located adjacent to the fourth doped region 102D, so that they are leveled and planar to each other.

In some embodiments, the doped regions (102A/102B/102C/102D) may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively, configured for a p-type FinFET based on design requirements. In some embodiments, the first doped region 102A and the third doped region 102C are doped with the same type of dopants, while the first doped region 102A has the higher doping concentration. In certain embodiments, the second doped region 102B and the fourth doped region 102D are doped with the same type of dopants, while the second doped region 102B has the higher doping concentration. In some embodiments, the first doped region 102A and the third doped region 102C are doped with different type dopants as compared with the second doped region 102B and the fourth doped region 102D. In one exemplary embodiment, the first doped region 102A is a heavy p-doped region, the second doped region 102B is a heavy n-doped region, the third doped region 102C is a light p-doped region and the fourth doped region 102D is a light n-doped region. In other words, doping concentrations of the third doped region 102C and the fourth doped region 102D are lower than doping concentrations of the first doped region 102A and the second doped region 102B.

In some alternative embodiments, the substrate 102 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. The disclosure is not limited thereto.

Figure 2A:
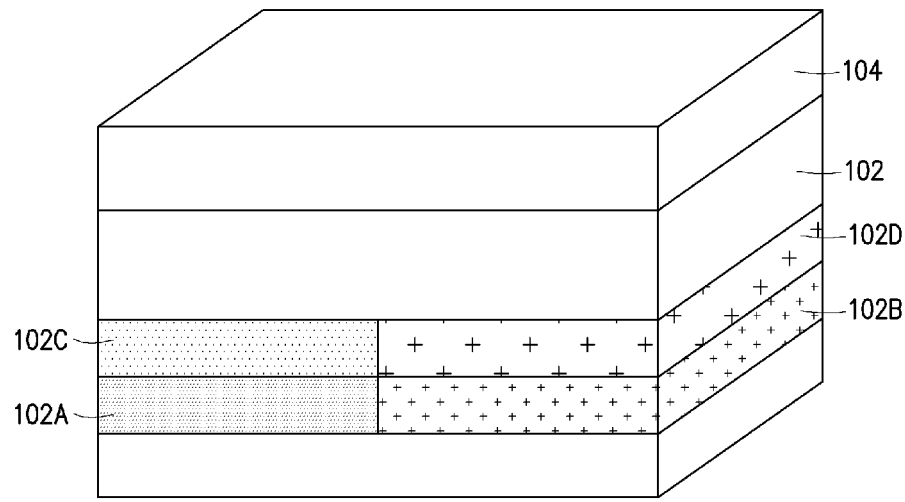
Figure 2B:
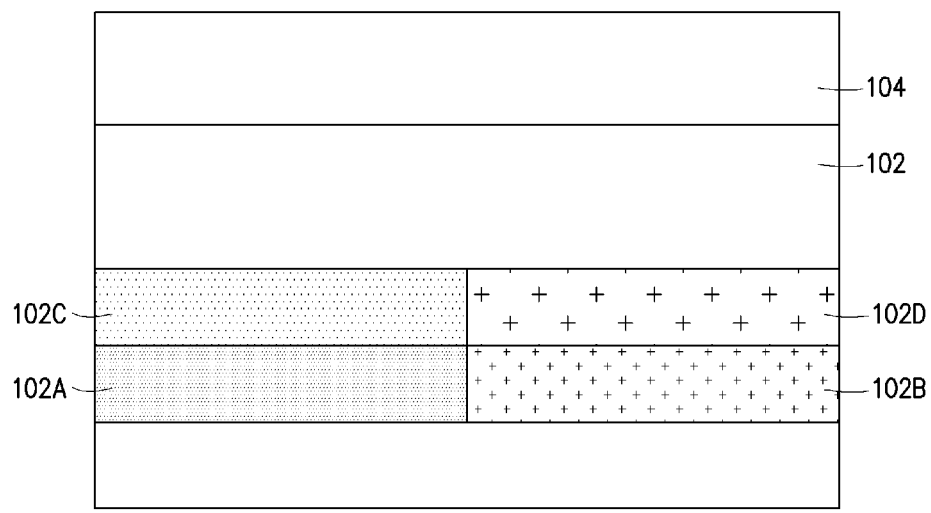

FIG. 2A is one stage in a method of fabricating a FinFET device in accordance with some embodiments of the present disclosure. FIG. 2B is a sectional view of the structure shown in FIG. 2A. Referring to FIG. 2A and FIG. 2B, in a next step, an active region layer 104 is formed over the substrate 102 to cover the substrate 102. In some embodiments, the active region layer 104 entirely covers the substrate 102. In certain embodiments, a material of the active region layer 104 is different than a material of the substrate 102. In some embodiments, the material of the active region layer 104 may be the same as the material of the substrate 102, but have difference in their crystalline form (e.g. for silicon). In certain embodiments, the active region layer 104 is, for example, a silicon epitaxial layer.

Figure 3A:
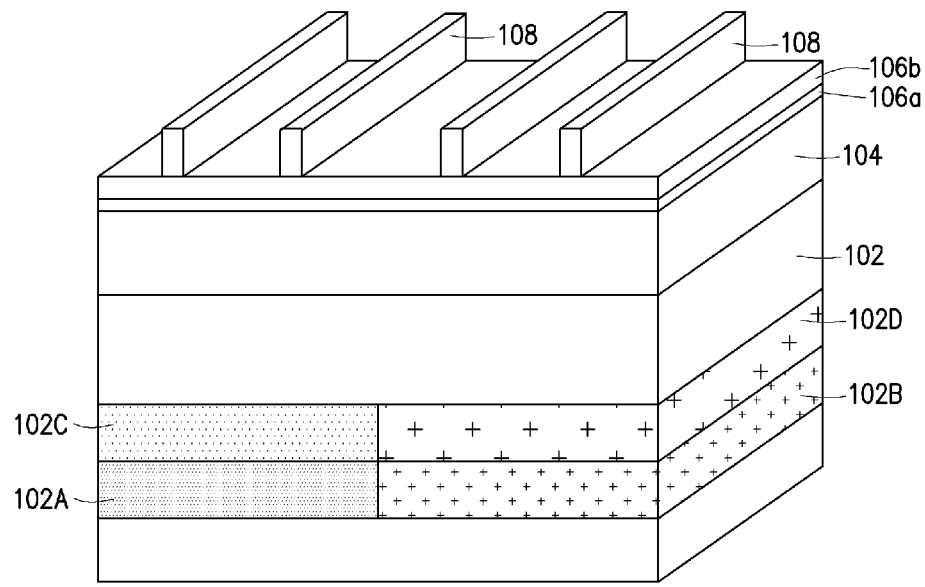
Figure 3B:
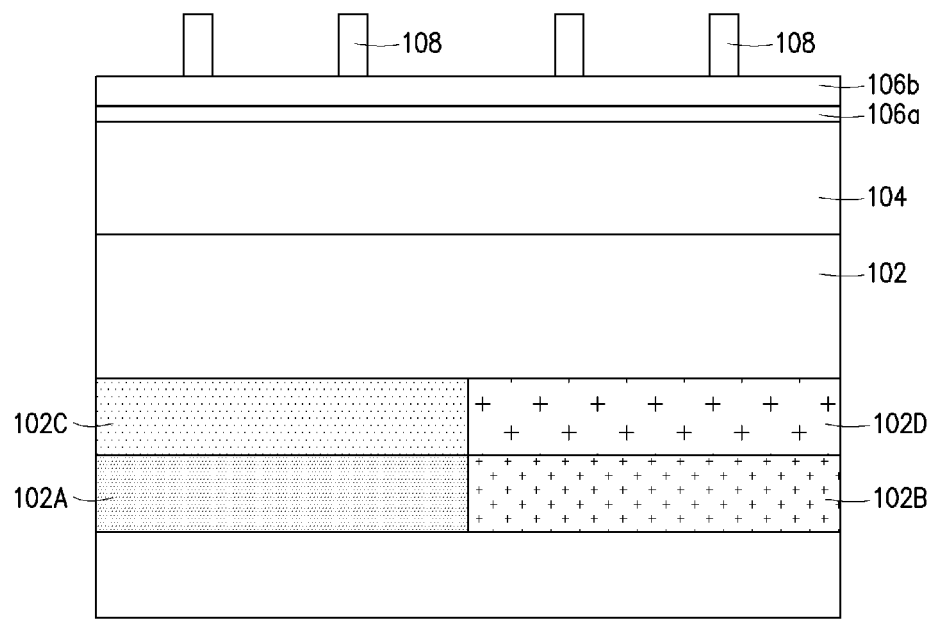

FIG. 3A is one stage in a method of fabricating a FinFET device in accordance with some embodiments of the present disclosure. FIG. 3B is a sectional view of the structure shown in FIG. 3A. Referring to FIG. 3A and FIG. 3B, in some embodiments, a pad layer 106a and a mask layer 106b are sequentially formed on the active region layer 104. The pad layer 106a may be a silicon oxide thin film formed by, for example, a thermal oxidation process. The pad layer 106a may act as an adhesion layer between the active region layer 104 and the mask layer 106b. In some embodiments, the mask layer 106b may be a silicon nitride layer formed by low-pressure chemical vapor deposition (LPCVD) or plasma enhanced chemical vapor deposition (PECVD). The mask layer 106b is used as a hard mask during subsequent photolithography processes. Thereafter, a patterned photoresist layer 108 having a predetermined pattern is formed on the mask layer 106b.

Figure 4A:
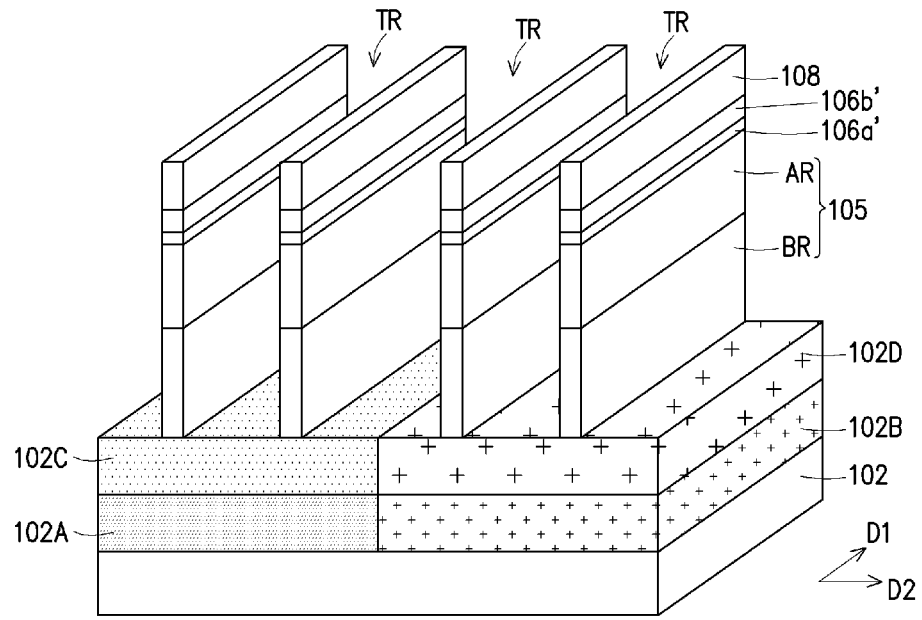
Figure 4B:
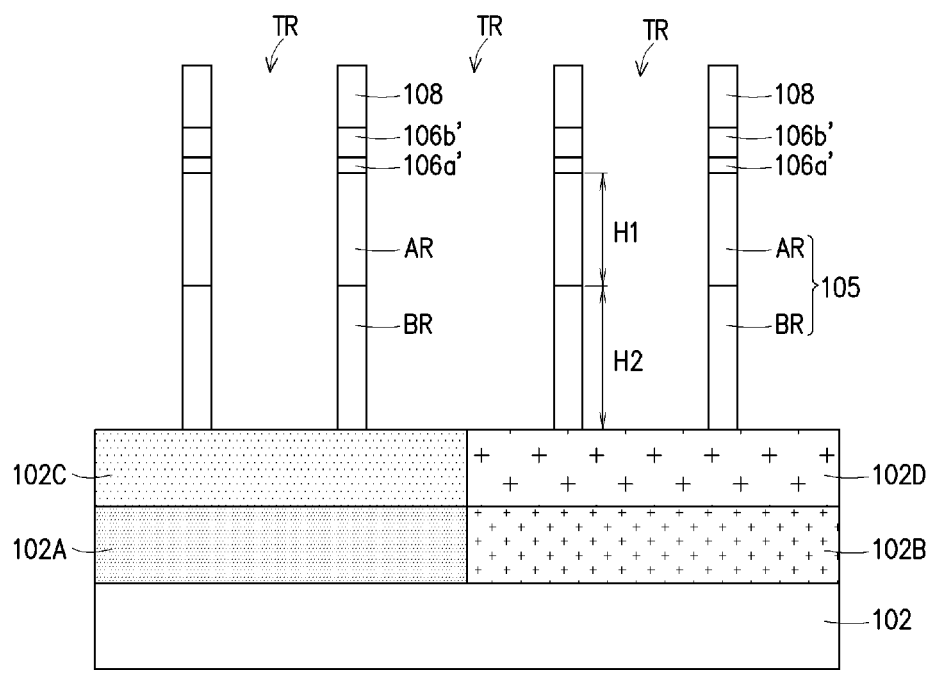

FIG. 4A is one stage in a method of fabricating a FinFET device in accordance with some embodiments of the present disclosure. FIG. 4B is a sectional view of the structure shown in FIG. 4A. Referring to FIG. 4A and FIG. 4B, after forming the patterned photoresist layer 108, portions of the mask layer 106b and the pad layer 106a which are not covered by the patterned photoresist layer 108 are sequentially etched to form a patterned mask layer 106b' and a patterned pad layer 106a' so as to expose the underlying active region layer 104. By using the patterned mask layer 106b', the patterned pad layer 106a' and the patterned photoresist layer 108 as a mask, portions of the active region layer 104 are exposed and etched to form trenches TR and a plurality of fins 105. Two adjacent trenches TR are spaced apart from each other by one of the fins 105. The fins 105 are extending along a first direction D1 and are parallel to one another and arranged along a second direction D2. In the illustrated embodiment, two of the fins 105 are located above the third doped region 102C of the substrate 102, whereas another two of the fins 105 are located above the fourth doped region 102D of the substrate 102. Although only four fins 105 are illustrated herein, it should be noted that the number of fins 105 are not limited thereto, and more fins 105 may be formed in accordance with actual design requirements.

After the substrate 102 and the active region layer 104 are patterned, the fins 105 are covered by the patterned mask layer 106b', the patterned pad layer 106a' and the patterned photoresist layer 108. In one embodiment, the substrate 102 and the active region layer 104 are patterned to form a plurality of fins 105 having an active channel region AR and a body region BR, wherein the active channel region AR is derived from the active region layer 104, and the body region BR is derived from the substrate 102. In some embodiments, a ratio of a height H1 of the active channel region to a height H2 of the body region is in a range of 1:1.25 to 1:3.5. In certain embodiments, the height H1 of the active channel region AR is in a range of 40 μm to 80 μm, and the height H2 of the body region BR is in a range of 100 μm to 140 μm. Furthermore, in some embodiments, after the patterning process, an optional cleaning process may be performed to remove a native oxide of the substrate 102 and the fins 105. The cleaning process may be performed using diluted hydrofluoric (DHF) acid or other suitable cleaning solutions.

Figure 5A:
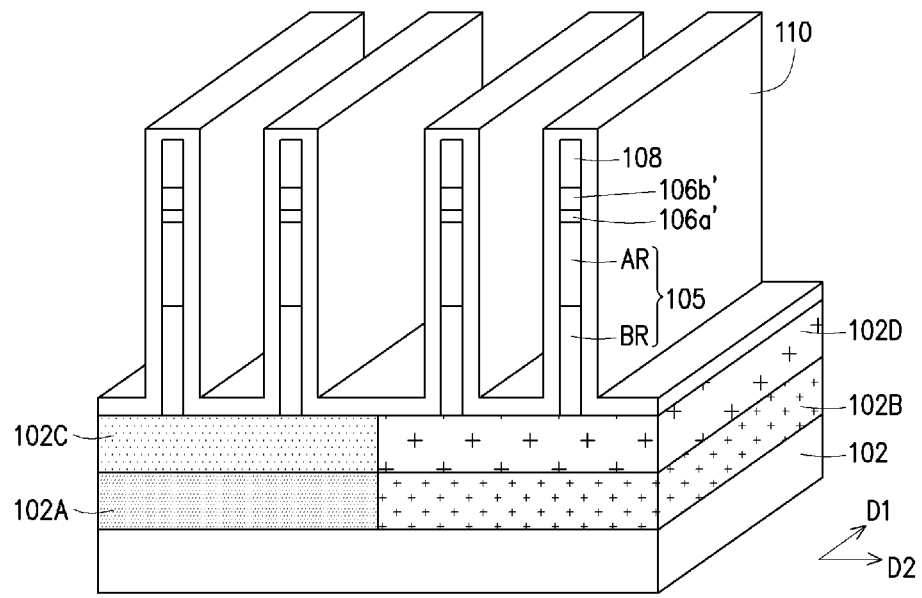
Figure 5B:
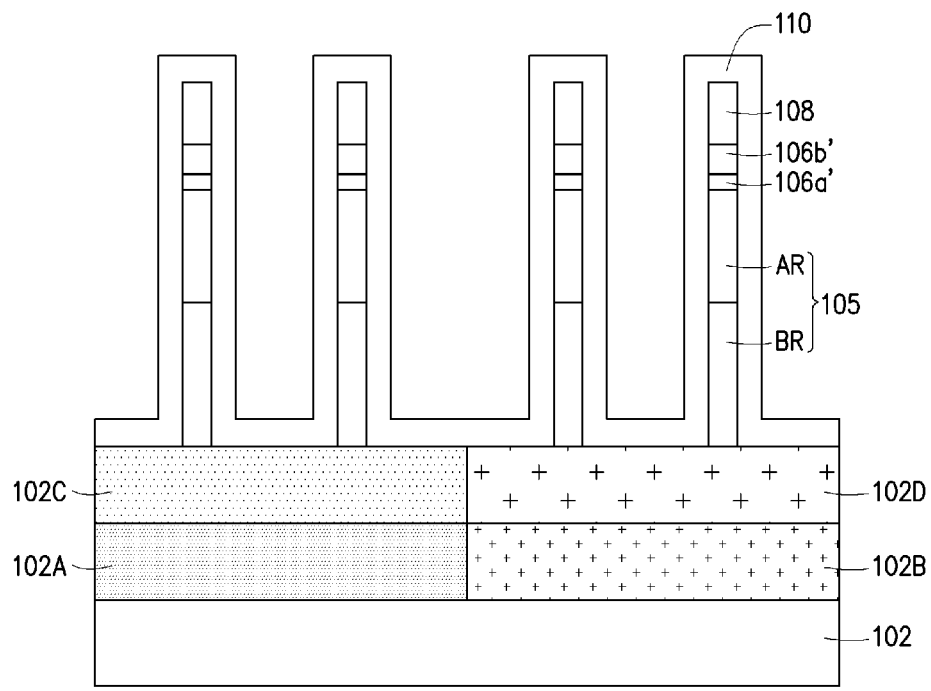

FIG. 5A is one stage in a method of fabricating a FinFET device in accordance with some embodiments of the present disclosure. FIG. 5B is a sectional view of the structure shown in FIG. 5A. Referring to FIG. 5A and FIG. 5B, an insulating material layer 110 is conformally formed over the substrate 102 to cover the fins 105 and to fill in the trenches TR. In addition to the fins 105, the insulating material layer 110 further covers the patterned mask layer 106b', the patterned pad layer 106a' and the patterned photoresist layer 108. The insulating material layer 110 may include silicon oxide, silicon oxynitride, other oxygen containing dielectric materials, or a low-k dielectric material. It should be noted that the low-k dielectric materials are generally dielectric materials having a dielectric constant lower than 3.9. The insulating material 210 may be formed by high-density-plasma chemical vapor deposition (HDP-CVD), sub-atmospheric CVD (SACVD), or spin on.

Figure 6A:
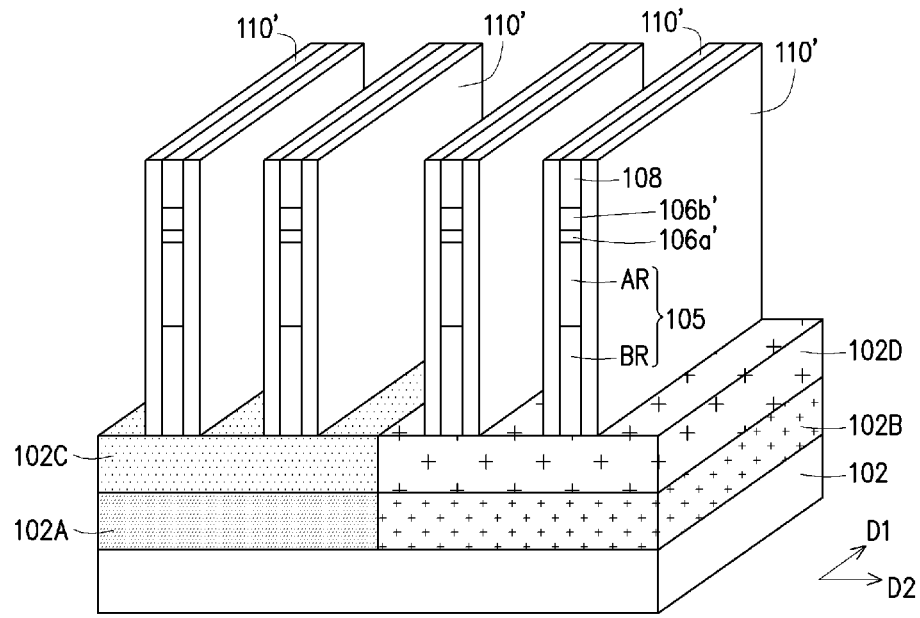
Figure 6B:
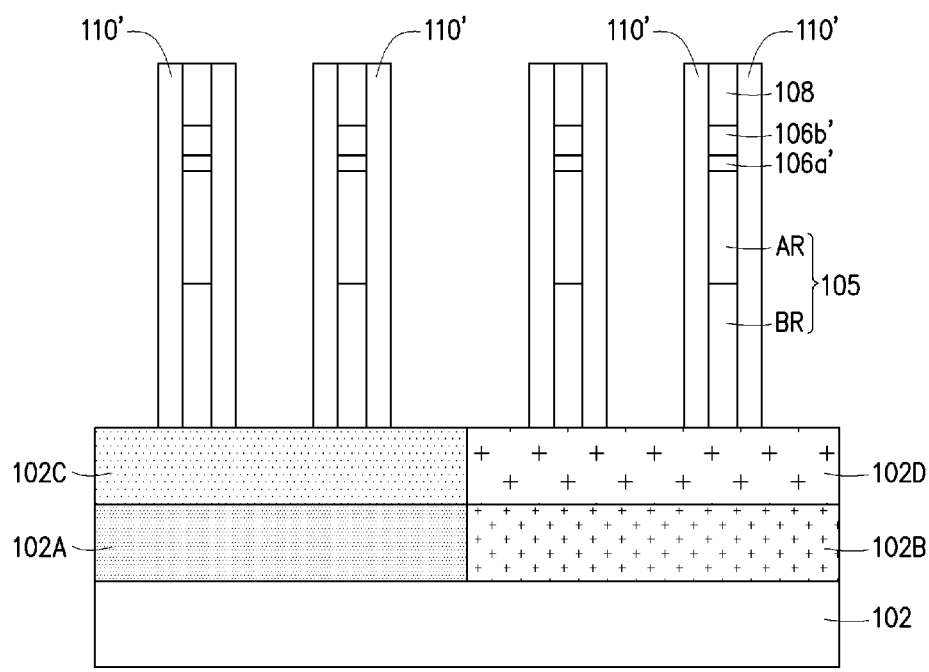

FIG. 6A is one stage in a method of fabricating a FinFET device in accordance with some embodiments of the present disclosure. FIG. 6B is a sectional view of the structure shown in FIG. 6A. Referring to FIG. 6A and FIG. 6B, a chemical mechanical polish (CMP) process and a wet etching process may be performed to remove portions of the insulating material layer 110 so as to form a plurality of insulators 110'. The plurality of insulators 110' may expose portions of the third doped region 102C and the fourth doped region 102D located underneath. In some embodiments, the plurality of insulators 110' is located on the substrate 102 and covering two opposite sides of the fins 105. In certain embodiments, the plurality of insulators 110' further covers sidewalls of the patterned mask layer 106b', the patterned pad layer 106a' and the patterned photoresist layer 108. In addition, a top surface of the patterned photoresist layer 108 is exposed from the plurality of insulators 110'. Furthermore, the top surface of the patterned photoresist layer 108 may be coplanar with a top surface of each of the insulators 110'.

Figure 7A:
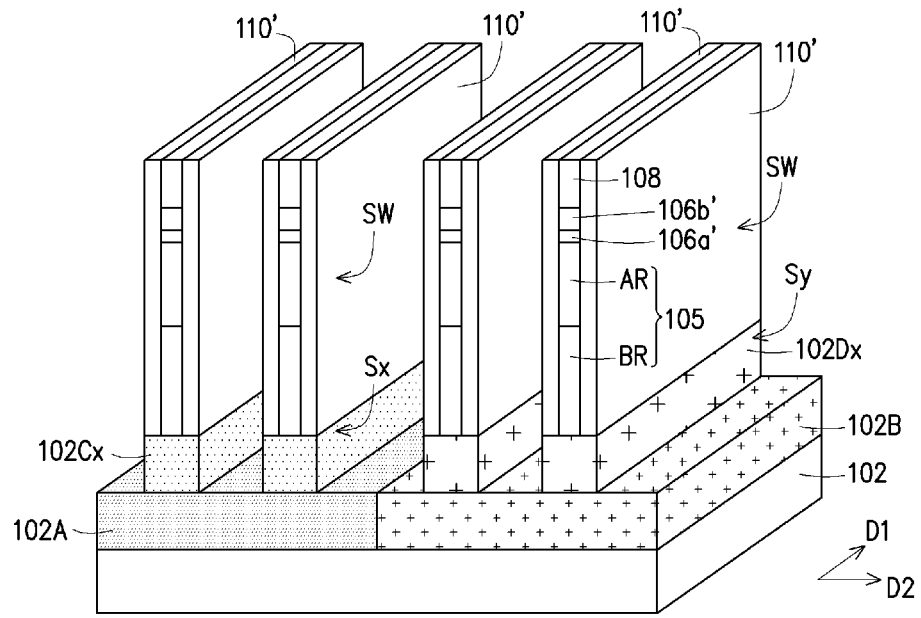
Figure 7B:
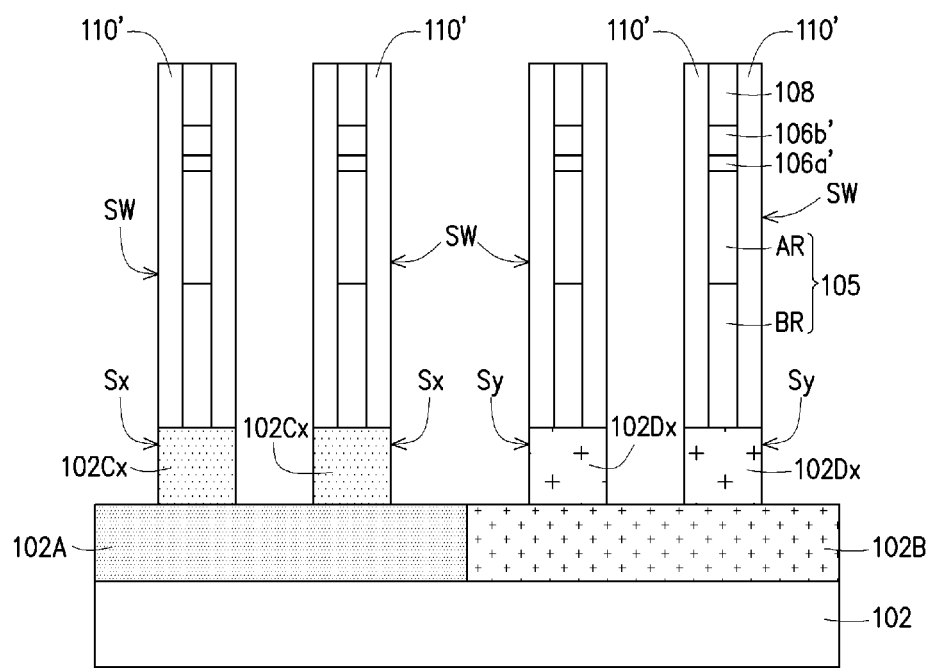

FIG. 7A is one stage in a method of fabricating a FinFET device in accordance with some embodiments of the present disclosure. FIG. 7B is a sectional view of the structure shown in FIG. 7A. Referring to FIG. 7A and FIG. 7B, after forming the plurality of insulators 110', the third doped region 102C and the fourth doped region 102D are patterned by using the plurality of insulators 110' as a mask. For example, the third doped region 102C and the fourth doped region 102D are patterned to form openings that define a plurality of third doped blocks 102Cx (light p-doped blocks) and a plurality of fourth doped blocks 102Dx (light n-doped blocks). In some embodiments, the third doped region 102C and the fourth doped region 102D are patterned by an etching process. In one embodiment, the etching process may be a wet etching process with hydrofluoric acid (HF) or a dry etching process.

After the patterning process or etching process to define the plurality of third doped blocks 102Cx and the plurality of fourth doped blocks 102Dx, sidewalls SW of the plurality of insulators 110' are aligned with sidewalls Sx of the plurality of third doped blocks 102Cx or aligned with sidewalls Sy of the plurality of fourth doped blocks 102Dx. In the exemplary embodiment, two of the third doped blocks 102Cx (light p-doped blocks) are located above each of the first doped region 102A (heavy p-doped region), and two of the fourth doped blocks 102Dx (light n-doped blocks) are located above each of the second doped region 102B (heavy n-doped region).

Figure 8A:
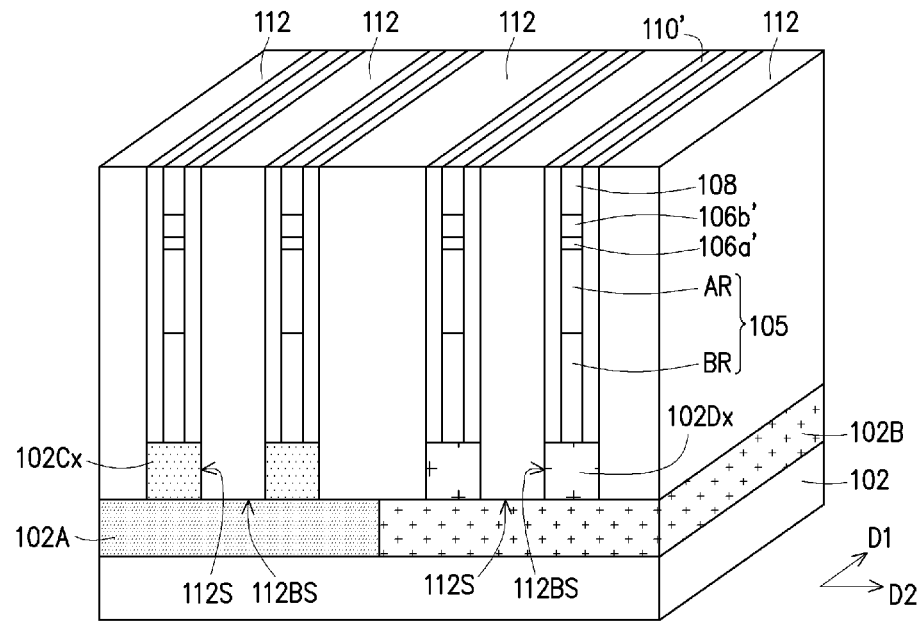
Figure 8B:
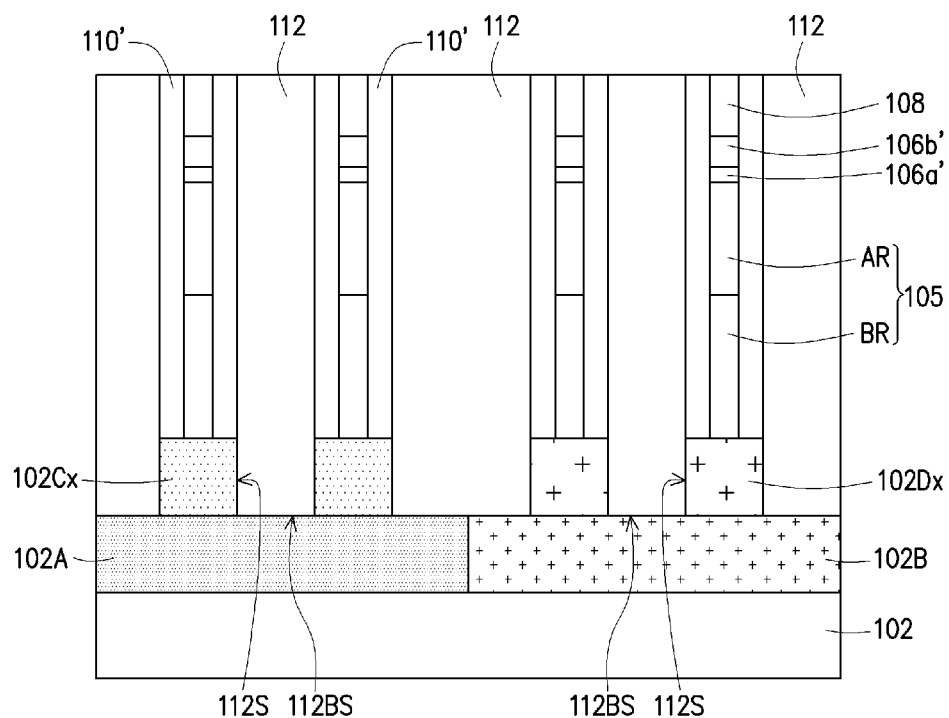

FIG. 8A is one stage in a method of fabricating a FinFET device in accordance with some embodiments of the present disclosure. FIG. 8B is a sectional view of the structure shown in FIG. 8A. Referring to FIG. 8A and FIG. 8B, in a next step, a plurality of dielectric strips 112 is formed to fill in the space in between the fins 105, and in between the plurality of third doped blocks 102Cx and the plurality of fourth doped blocks 102Dx. In some embodiments, the dielectric strips 112 surrounds the third doped blocks 102Cx, the fourth doped blocks 102Dx, and surrounds the fins 105 and the plurality of insulators 110'. In certain embodiments, a bottom surface 112BS of the dielectric strips 112 is in contact with the first doped region 102A and/or the second doped region 102B, and sidewalls 112S of the dielectric strips 112 is in contact with the third doped blocks 102Cx and/or the fourth doped region 102Dx.

In the exemplary embodiment, the dielectric strips 112 is made of nitrides such as silicon nitride (SiN) or silicon carbon nitride (SiCN), or made of high-k materials having a dielectric constant of greater than about 4, greater than about 12, greater than about 16, or even greater than about 20. For example, the high-k materials may include metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In some alternative embodiments, the high-k materials may include may optionally include a silicate such as HfSiO, HfSiON, LaSiO, AlSiO, a combination thereof, or a suitable material. In some embodiments, when the FinFET device is used in a memory device, such as in a static random-access memory (SRAM) device, then the dielectric strips 112 are made of high-k materials. In some alternative embodiments, when the FinFET is used in logic devices, then other low-k materials may also be selected as the material of the dielectric strips 112. In some embodiments, the method of forming the dielectric strips 112 includes performing at least one suitable deposition technique, such as CVD, PECVD, metal oxide chemical vapor deposition (MOCVD), ALD, remote plasma atomic layer deposition (RPALD), plasma-enhanced atomic layer deposition (PEALD), molecular beam deposition (MBD), or the like.

Figure 9A:
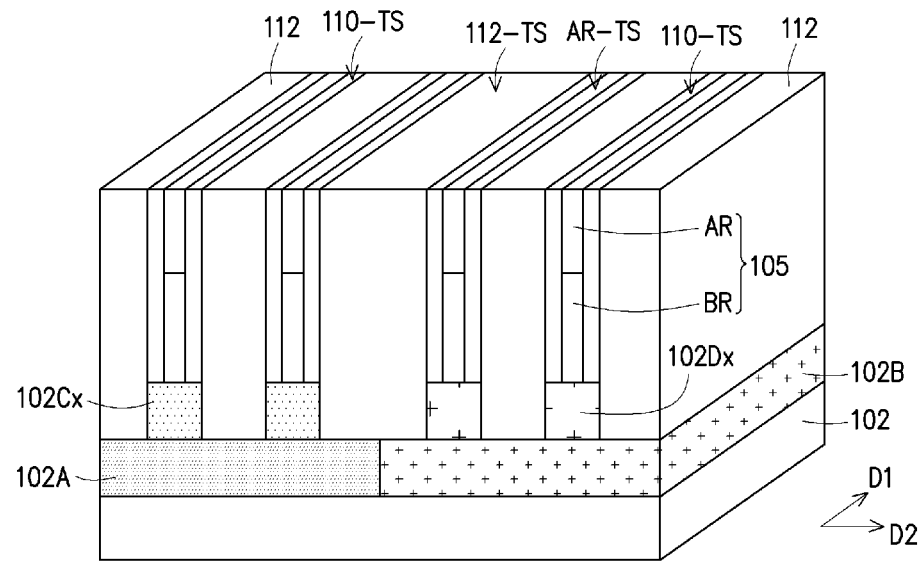
Figure 9B:
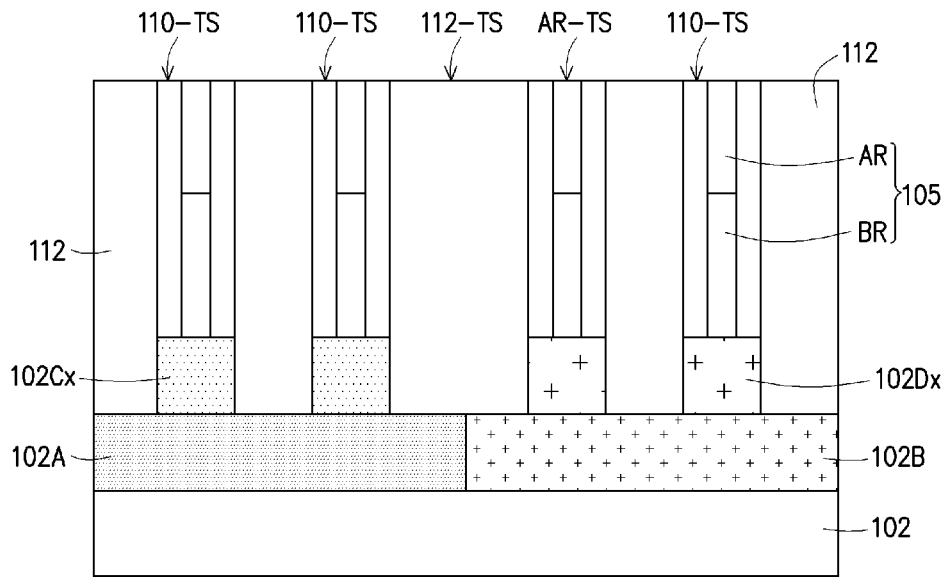

FIG. 9A is one stage in a method of fabricating a FinFET device in accordance with some embodiments of the present disclosure. FIG. 9B is a sectional view of the structure shown in FIG. 9A. Referring to FIG. 9A and FIG. 9B, after forming the dielectric strips 112, portions of the dielectric strips 112 and portions of the insulators 110' are removed by a planarization process, an etching process, or other suitable processes. In some embodiments, the planarization process may include performing a chemical mechanical polishing (CMP) process. Furthermore, the patterned mask layer 106b', the patterned pad layer 106a' and the patterned photoresist layer 108 are also removed during the planarization process. In some embodiments, the dielectric strips 112 and the insulators 110' are polished until top surfaces AR-TS of the active channel region AR are exposed. As illustrated in FIG. 9A and FIG. 9B, after the planarization process, the top surface AR-TS of the active channel region AR is substantially coplanar with a top surface 110-TS of the insulators 110' and a top surface 112-TS of the dielectric strips 112.

Figure 10A:
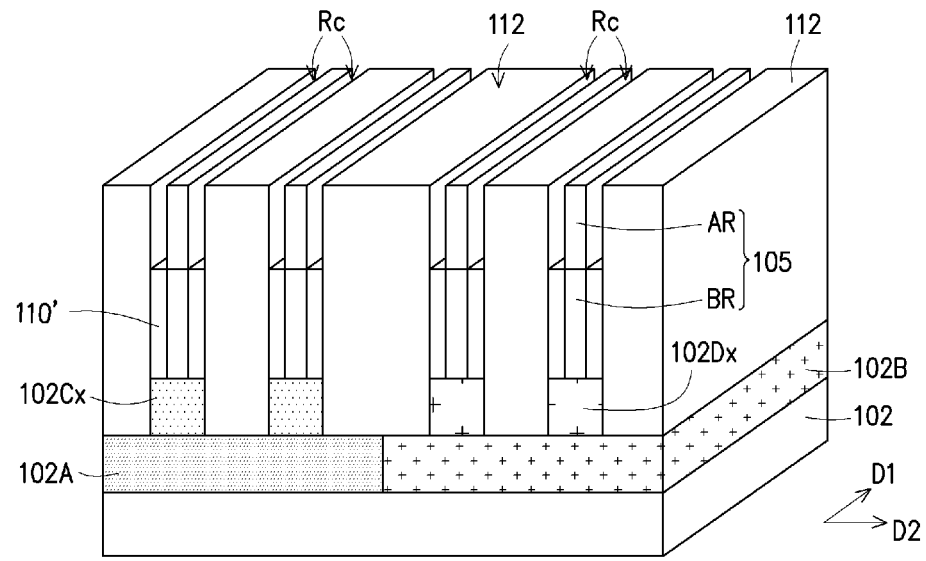
Figure 10B:
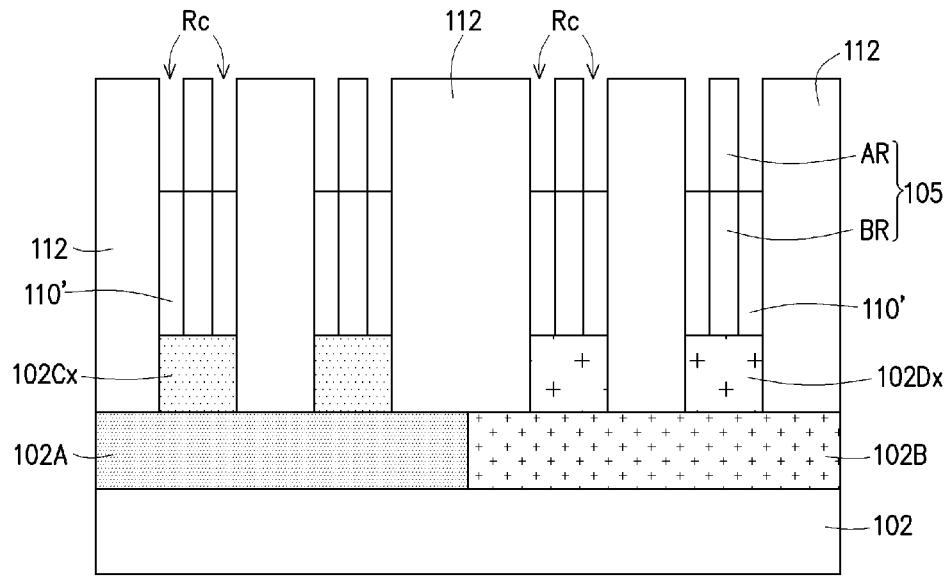

FIG. 10A is one stage in a method of fabricating a FinFET device in accordance with some embodiments of the present disclosure. FIG. 10B is a sectional view of the structure shown in FIG. 10A. Referring to FIG. 10A and FIG. 10B, in a next step, portions of the insulators 110' are removed by an etching process. For example, through either wet etching or dry etching processes. As illustrated in FIG. 10A and FIG. 10B, the etching process is performed to remove the insulators 110' covering the active channel region AR of the fins 105. In other words, a plurality of recesses Rc are formed after the etching process to reveal the active channel region AR of the fins 105. Furthermore, in some embodiments, the remaining insulators 110' cover only the body region BR of the fins 105. In certain embodiments, the active channel region AR protrudes out of the insulators 110' after the etching process.

Figure 11A:
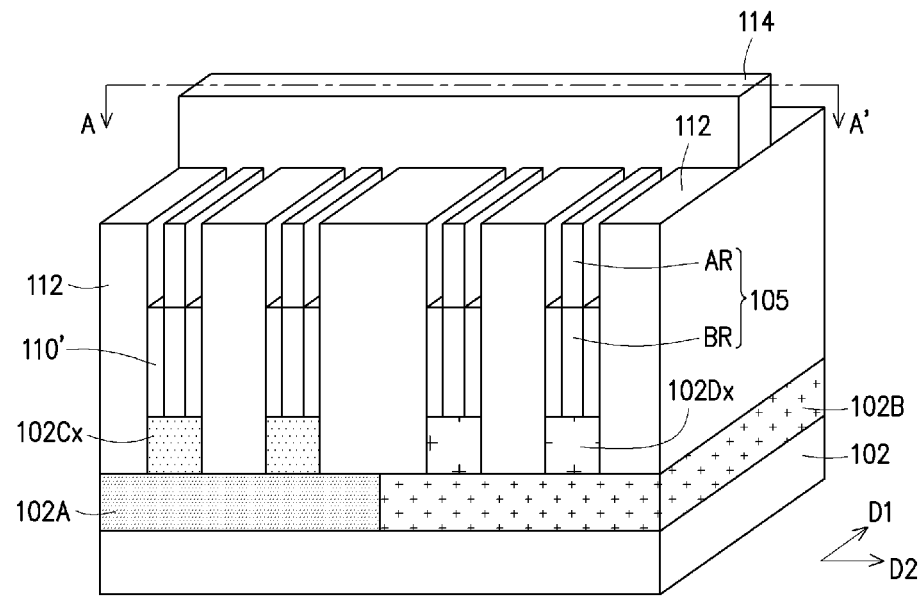
Figure 11B:
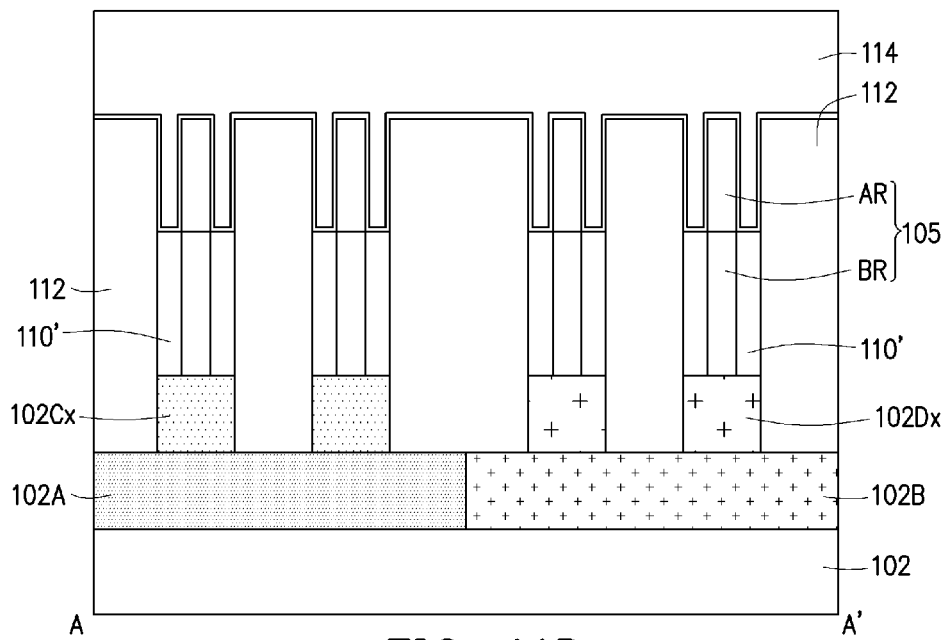

FIG. 11A is one stage in a method of fabricating a FinFET device in accordance with some embodiments of the present disclosure. FIG. 11B is a sectional view taken along the line A-A' of the structure shown in FIG. 11A. Referring to FIG. 11A and FIG. 11B, a gate stack 114 is formed over the fins 105, the insulators 110' and the dielectric strips 112 and wraps around the active channel region AR of the fins 105. The gate stack 114 is extending along the second direction D2, and intersects with the plurality of fins 105. In the exemplary embodiment, the gate stack 114 may be formed by a gate-first process, but the disclosure is not limited thereto. In some embodiments, the gate stack 114 comprises a gate dielectric layer and a gate electrode layer (not shown). For example, the gate dielectric layer may be conformally formed over the dielectric strips 112, the insulators 110' and the fins 105, whereas the gate electrode layer may be formed on the gate dielectric layer. In some alternative embodiments, the gate stack 114 may be formed by a gate-last process. For example, in the gate-last process, a dummy gate stack is formed with spacers located on the sidewalls of the dummy gate stack. Thereafter, the dummy gate stack within the sidewall spacers may be replaced with the gate stack in the subsequent steps.

In some embodiments, a material of the gate dielectric layer of the gate stack 114 includes silicon oxide, silicon nitride, silicon oxy-nitride, high-K dielectric materials, or a combination thereof. High-K dielectric materials include metal oxides such as oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or a combination thereof. Furthermore, the gate dielectric layer is formed using a suitable process such as atomic layer deposition (ALD), chemical vapor deposition (CVD), physical vapor deposition (PVD), flowable chemical vapor deposition (FCVD), thermal oxidation, UV-ozone oxidation, or a combination thereof. The gate dielectric layer may further comprise an interfacial layer (not shown). For example, the interfacial layer may be used in order to create a good interface between the fins 105 and the gate electrode layer, as well as to suppress the mobility degradation of the channel carrier of the semiconductor device. Moreover, the interfacial layer is formed by a thermal oxidation process, a chemical vapor deposition (CVD) process, or an atomic layer deposition (ALD) process. A material of the interfacial layer includes a dielectric material, such as a silicon oxide layer or a silicon oxynitride layer.

In some embodiments, a material of the gate electrode layer of the gate stack 114 includes metal, metal alloy, or metal nitride. For example, in some embodiments, the gate electrode layer may include TiN, WN, TaN, Ru, Ti, Ag, Al, TiAl, TiAlN, TaC, TaCN, TaSiN, Mn, or Zr. Moreover, the gate electrode layer may further include a barrier, a work function layer, or a combination thereof. As mentioned above, an interfacial layer may be included between the gate electrode layer and the fins 105, but it construes no limitation to the present disclosure. In some alternative embodiments, a liner layer, a seed layer, an adhesion layer, or a combination thereof may also be included between the gate electrode layer and the fins 105. After forming the gate stack 114, subsequent process of forming metallic interconnection (not illustrated) can be implemented. For instance, other conductive lines (not illustrate) are formed to electrically connect the gate electrode layer with other elements in the semiconductor device.

Figure 12A:
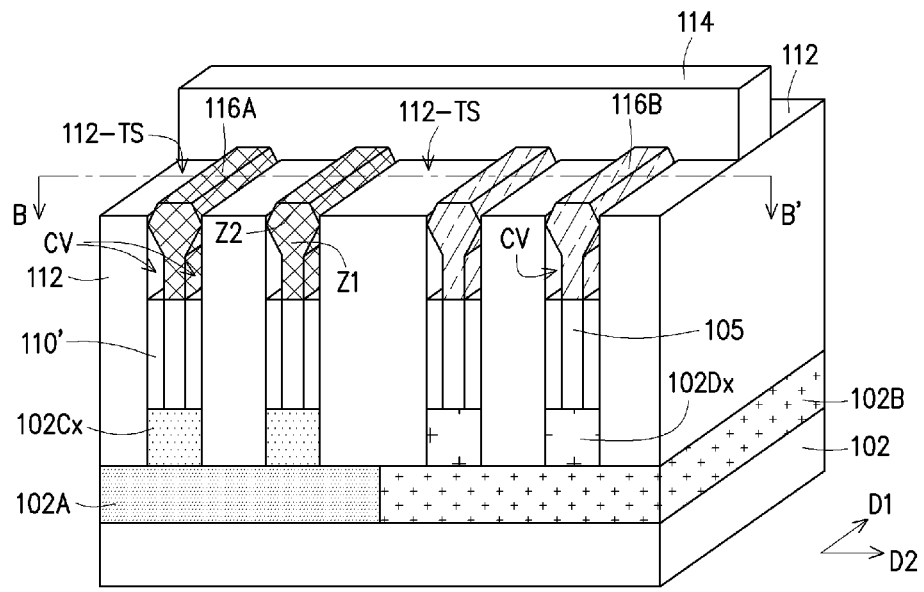
Figure 12B:
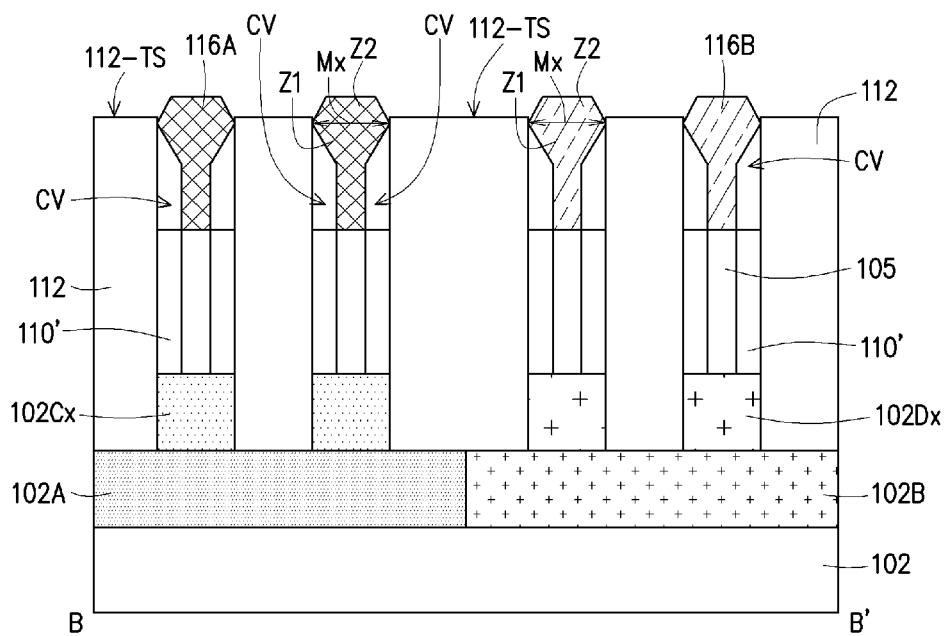

FIG. 12A is one stage in a method of fabricating a FinFET device in accordance with some embodiments of the present disclosure. FIG. 12B is a sectional view taken along the line B-B' of the structure shown in FIG. 12A. Referring to FIG. 12A and FIG. 12B, after forming the gate stack 114, exposed portions (shown in FIGS. 11A and 11B) of the active channel region AR of the fins 105 are recessed, for example, by using anisotropic etching, isotropic etching or the combination thereof. On the other hand, the portions of the active channel region AR of the fins 105 that are covered by the gate stack 114 is not removed while the exposed portions of the fins 105 are recessed. In some embodiments, the fins 105 are recessed until the body portions BR of the fins 105 are revealed. After the exposed portions of the active channel region AR of the fins 105 are recessed, strained material portions (116A/116B) are filled in the recess and in between the dielectric strips 112. In some embodiments, the exposed portions of the active channel regions AR of the fins 105 are partially recessed. In some embodiments, the exposed portions of the active channel regions AR of the fins 105 are substantially removed. In some other embodiments, the exposed portions of the active channel region AR of the fins 105 are not recessed, and the strained material portions (116A/116B) are formed around the exposed portions of the active channel regions AR of the fins 105.

In the illustrated embodiment, the strained material portions (116A/116B) are located on opposite sides of the gate stack 114. In some embodiments, the strained material portions (116A/116B) comprise SiGe, silicon carbon (SiC) or SiP, for example. In certain embodiments, the strained material portions (116A/116B), such as SiGe, is epitaxial-grown with a p-type dopant for straining a p-type FinFET. That is, the strained material portions (116A/116B) are doped with the p-type dopant to be the source and the drain of the p-type FinFET. The p-type dopant comprises boron or $BF_2$, and the strained material portions (116A/116B) may be epitaxial-grown by LPCVD process with in-situ doping. In another embodiment, the strained material portions (116A/116B), such as SiC, SiP, a combination of SiC/SiP, or SiCP is epitaxial-grown with an n-type dopant for straining an n-type FinFET. That is, the strained material portions (116A/116B) are doped with the n-type dopant to be the source and the drain of the n-type FinFET. The n-type dopant comprises arsenic and/or phosphorus, and the strained material portions (116A/116B) may be epitaxial-grown by LPCVD process with in-situ doping. The strained material portions (116A/116B) may be a single layer or a multi-layer. In one exemplary embodiment, the strained material portions 116A located on the first doped region 102A (heavy p-doped region) are doped with the n-type dopants, whereas the strained material portions 116B located on the second doped region 102B (heavy n-doped region) are doped with the p-type dopants.

As shown in FIG. 12A and FIG. 12B, in some embodiments, a maximum lateral dimension Mx of the strained material portions (116A/116B) is approximately equal to a distance between two most adjacent dielectric strips 112. Furthermore, each of the strained material portions (116A/116B) have a bottom section Z1 with tapered sidewalls and a top section Z2 joined with the bottom section Z1 with tapered sidewalls. In certain embodiments, a position where the bottom section Z1 meets the top section Z2 is the maximum lateral dimension Mx of the strained material portions (116A/116B). Additionally, the bottom section Z1 of the strained material portions (116A/116B) is not higher than a top surface 112-TS of the dielectric strips 112. In other words, during the epitaxial growth of the strained material portions (116A/116B), the size of these strained material portions (116A/116B) is limited by the dielectric strips 112. That is, the maximum lateral dimension Mx of the strained material portions (116A/116B) will not grow larger than a distance between each of the dielectric strips 112. As such, a merging issue of the strained material portions (116A/116B) may be prevented.

In the exemplary embodiment, after epitaxial growth of the strained material portions (116A/116B), a plurality of cavities Cv are formed in between the bottom section Z1 of the strained material portions (116A/116B) and the plurality of dielectric strips 112. These cavities Cv are formed as the strained material portions (116A/116B) are grown to contact the sidewalls 112S of the dielectric strips 112, hence cavities Cv are generated after the epitaxial growth.

Figure 13A:
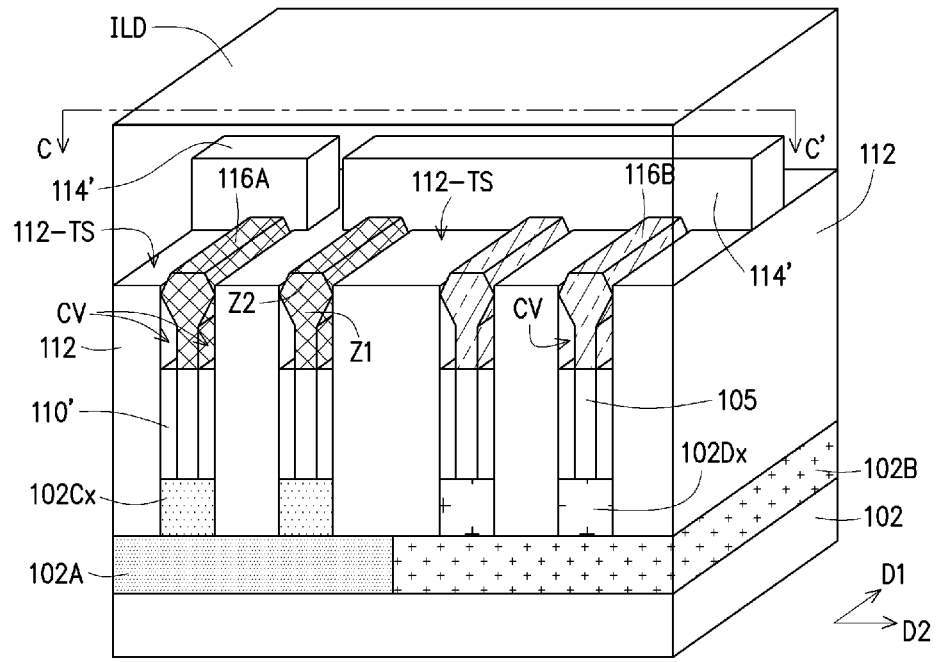
Figure 13B:
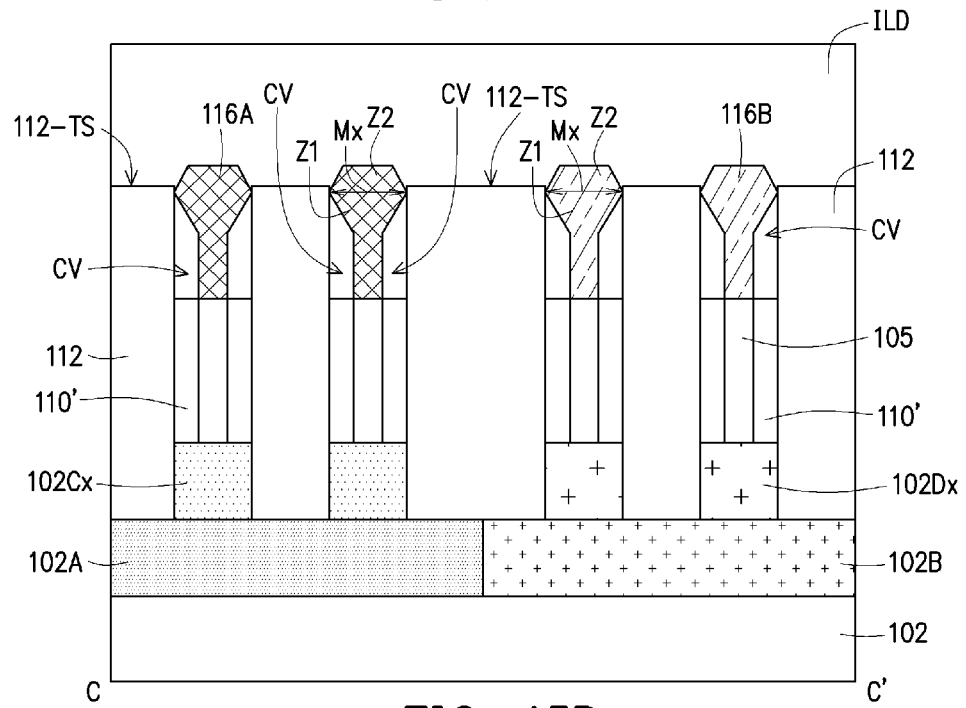

FIG. 13A is one stage in a method of fabricating a FinFET device in accordance with some embodiments of the present disclosure. FIG. 13B is a sectional view taken along the line C-C' of the structure shown in FIG. 13A. Referring to FIGS. 13A and 13B, after growing the strained material portions, the gate stack 114 may be optionally patterned so as to form separate gate stack portions 114'. It is noted that the gate stack 114 may be patterned and separated based on actual design requirement of the device. In a next step, an interlayer dielectric layer ILD may be formed over the strained material portions (116A/116B) and over the gate stack portions 114'. In FIG. 13A, the interlayer dielectric layer ILD is shown to be transparent (revealing the underlying components) for the ease of illustration. In the exemplary embodiment, as the maximum lateral dimension Mx of the strained material portions (116A/116B) is equal to the distance between two most adjacent dielectric strips 112, the interlayer dielectric layer ILD formed thereafter will not fill into the cavities Cv.

Figure 14A:
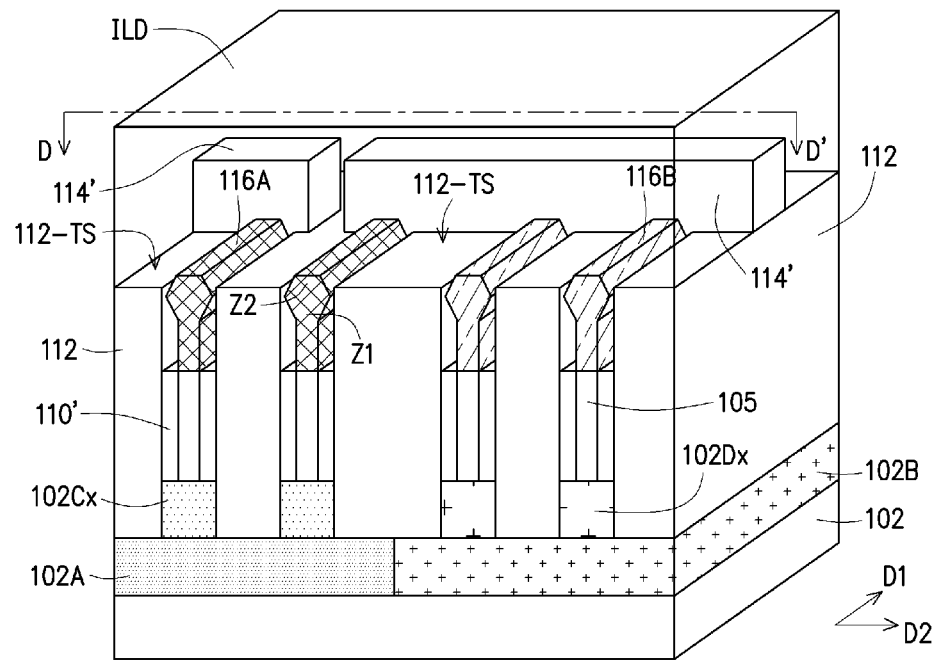
FIG. 14A and FIG. 14B are schematic and sectional views of a FinFET device in accordance with some other embodiments of the present disclosure.
Figure 14B:
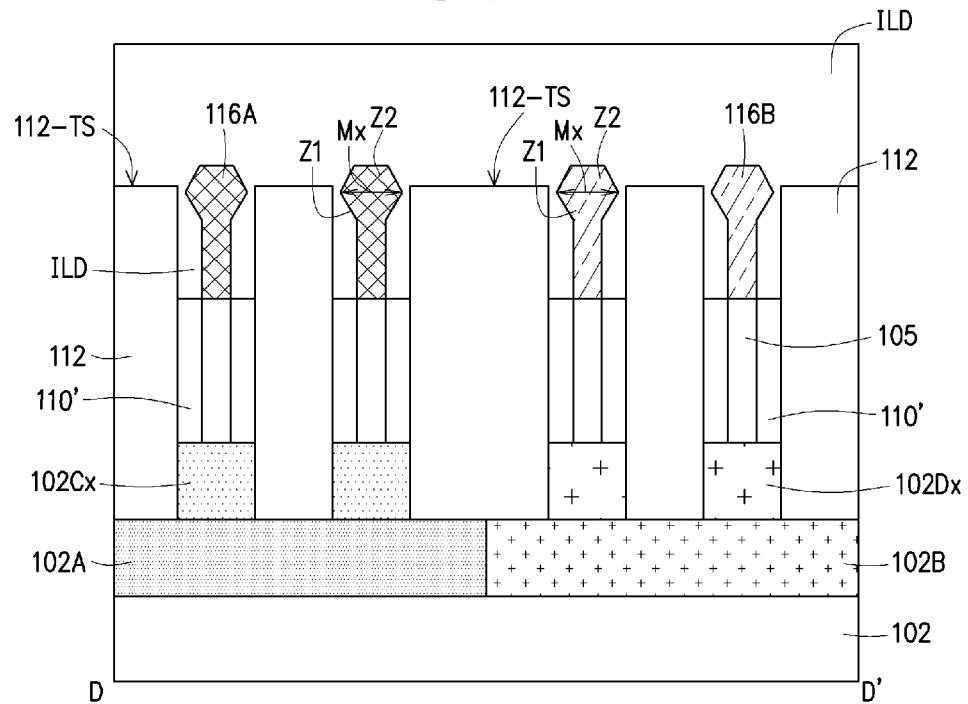

FIG. 14A is one stage in a method of fabricating a FinFET device in accordance with some embodiments of the present disclosure. FIG. 14B is a sectional view taken along the line D-D' of the structure shown in FIG. 14A. The FinFET device shown in FIG. 14A and FIG. 14B is similar to the FinFET device shown in FIG. 13A and FIG. 13B, hence the same reference numerals are used to refer to the same and liked parts, and its detailed description will not be repeated herein. The difference between the FinFET devices of FIGS. 13A-13B and FIGS. 14A-14B, is that the strained material portions (116A/116B) of FIGS. 14A-14B do not contact the sidewalls 112S of the dielectric strips 112. In other words, a maximum lateral dimension Mx of the strained material portions (116A/116B) is smaller than a distance between two most adjacent dielectric strips 112. As such, when the interlayer dielectric layer ILD is formed in a subsequent step, it will fill up the spaces in between the strained material portions (116A/116B) and the plurality of dielectric strips 112 (see FIGS. 14A and 14B).

Figure 15A:
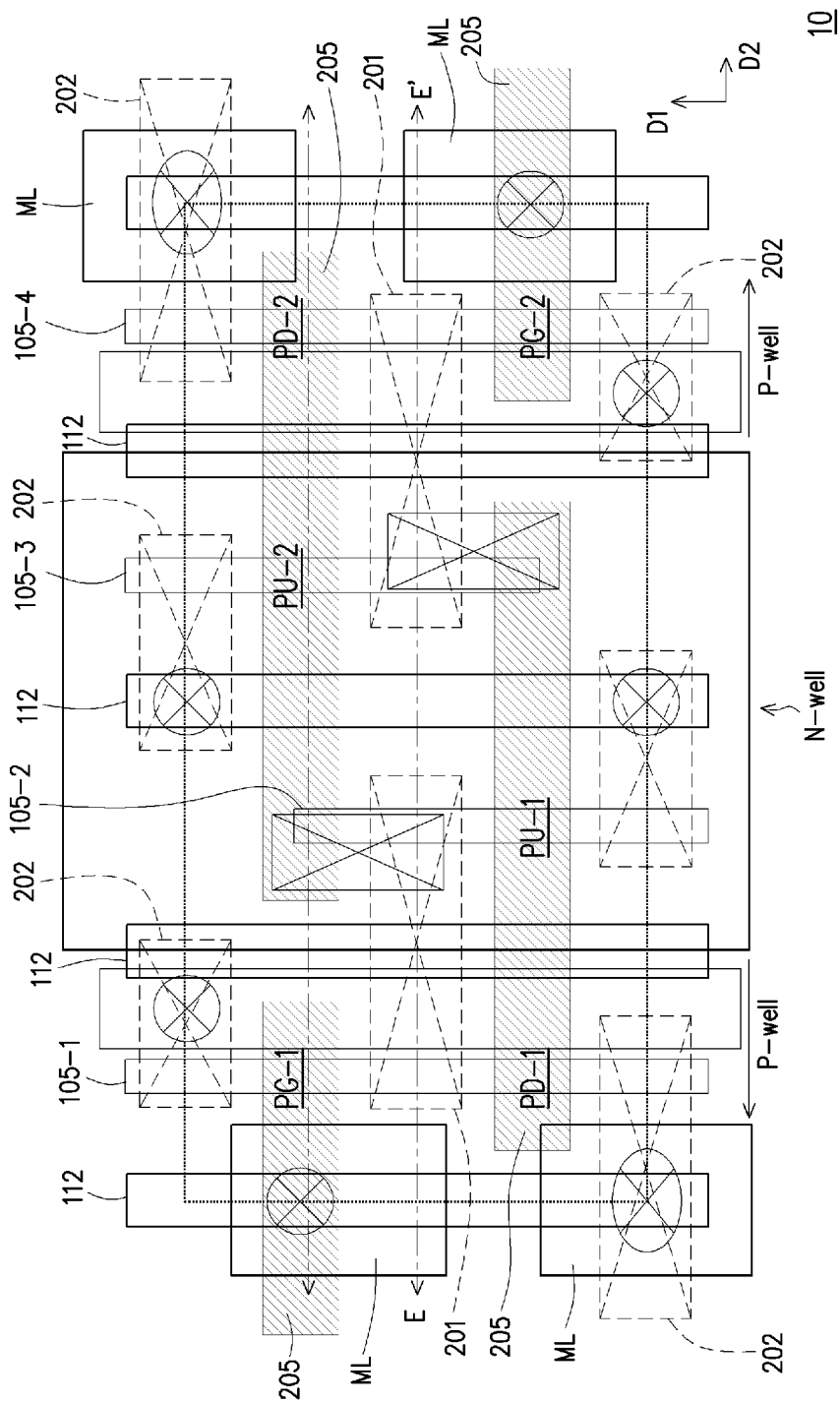
FIG. 15A is an SRAM layout in accordance with some embodiments of the present disclosure.
Figure 15B:
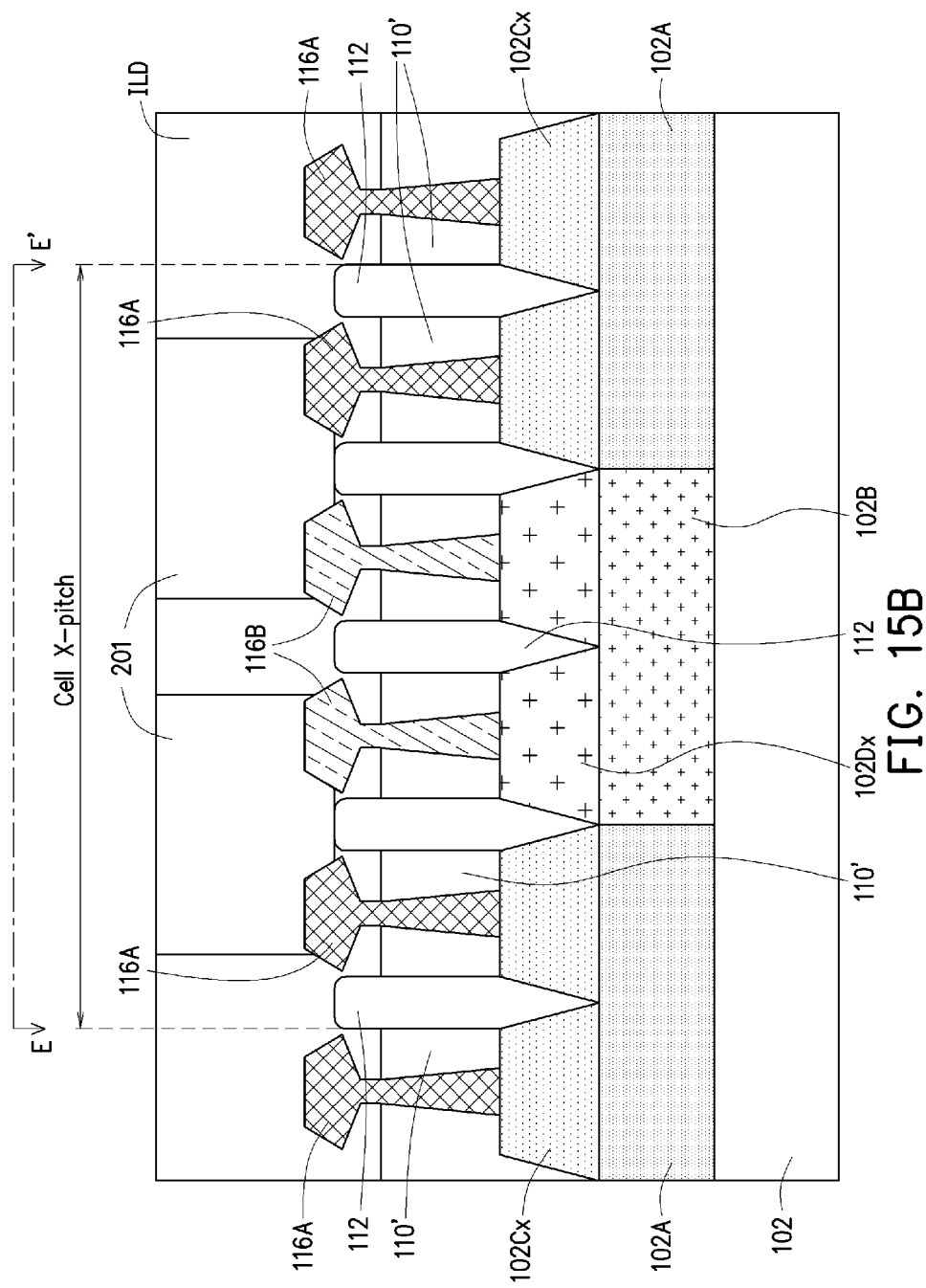
FIG. 15B is an exemplary sectional view of the SRAM layout shown in FIG. 15A.

FIG. 15A is an SRAM layout in accordance with some embodiments of the present disclosure. FIG. 15B is an extended exemplary sectional view taken along the line E-E' of the SRAM layout shown in FIG. 15A. FIG. 15A and FIG. 15B illustrate exemplary applications of FinFET devices of the above embodiments in a static random-access memory (SRAM) device. Referring to FIG. 15A, an exemplary layout of a SRAM cell 10 is illustrated. In some embodiments, the SRAM cell 10 includes three wells, which are an N-type well (N-well) located at a center thereof and first and second P-type wells (P-wells) located on opposite sides of the N-well. Although only the boundaries of the N-well are marked, one having ordinary skill in the art should understand that the first and second P-well occupy the remaining portions of the SRAM cell 10. In certain embodiments, the N-well may include a second doped region 102B (heavy n-doped region) and a plurality of fourth doped blocks 102Dx (light n-doped blocks) located above the second doped region 102B. Furthermore, the P-well may each include a first doped region 102A (heavy p-doped region) and a plurality of third doped blocks 102Cx (light p-doped blocks) located above the first doped region 102A.

As illustrated in FIG. 15A and FIG. 15B, in some embodiments, the SRAM cell 10 includes a first semiconductor fin 105-1, a second semiconductor fin 105-2, a third semiconductor fin 105-3, and a fourth semiconductor fin 105-4 each extending along the first direction D1. The semiconductor fins 105-1, 105-2, 105-3 and 105-4 are arranged in parallel and spaced apart from one another. The semiconductor fins 105-1, 105-2, 105-3 and 105-4 are respectively located on the P-well or on the N-well. In certain embodiments, each SRAM cell 10 further includes five dielectric strips 112, which separates the semiconductor fins 105-1, 105-2, 105-3 and 105-4 from one another. The five dielectric strips 112 and the semiconductor fins 105-1, 105-2, 105-3 and 105-4 are alternately arranged along the second direction D2 to occupy one cell pitch (cell X-pitch).

Source, drain, and channel regions of the first pass-gate transistor PG-1 and the first pull-down transistor PD-1 of the SRAM cell 10 are made by the first semiconductor fin 105-1. Source, drain, and channel regions of the second pass-gate transistor PG-2 and the second pull-down transistor PD-2 are made by the fourth semiconductor fin 105-4. Source, drain, and channel regions of the first pull-up transistor PU-1 of the SRAM cell 10 and source, drain, and channel regions of the second pull-up transistor PU-2 of the SRAM cell 10 are made by the second and third semiconductor fins 105-2 and 105-3 respectively.

Furthermore, as shown in FIG. 15A and FIG. 15B, the SRAM cell 10 includes a plurality of gate electrodes 205 (gate stacks) that are spaced-apart from each other. In some embodiments, one of the gate electrodes 205 is formed over the channel region of the first pass-gate transistor PG-1, one of the gate electrodes 205 is formed over the channel regions of the second pull-up transistor PU-2, the second pull-down transistor PD-2, one of the gate electrodes 205 is formed over the channel region of the second pass-gate transistor PG-2, and one of the gate electrodes 205 is formed over the channel regions of the first pull-up transistor PU-1 and the first pull-down transistor PD-1. In addition, the SRAM cell 10 includes contacts 201 that are disposed on the strained material portions 116A/116B, and an interlayer dielectric layer ILD covering/surrounding the contacts 201. In some embodiments, the contacts 201 are electrically connected to the gate electrodes 205. In certain embodiments, the SRAM cell 10 further includes additional contacts 202 for providing electrical connection therebetween and metal lines ML as landing pads for further electrical connection.

In the above-mentioned embodiments, a plurality of third doped blocks (light doped blocks) and a plurality of fourth doped blocks (light doped blocks) are formed on the first doped region (heavy doped region) and the second doped region (heavy doped region) respectively. As such, it is possible to create a far leakage path, which helps to prevent leakage current induced by PN junction inter-diffusion. In addition, the growth of the strained material portions can be appropriately controlled, as their size is limited by the position of the dielectric strips. Thus, a merging issue of the strained material portions may be prevented. Overall, the latch-up trigger voltage, and the P-well/N-well sheet resistance of the FinFET device may also be improved.

In some embodiments of the present disclosure, a fin-type field-effect transistor (FinFET) device including a substrate, insulators, dielectric strips, and at least one gate stack is provided. The substrate includes a first doped region, a second doped region, third doped blocks located above the first doped region, fourth doped blocks located above the second doped region, and fins located above the third doped blocks and the fourth doped blocks, wherein doping concentrations of the third doped blocks are lower than a doping concentration of the first doped region, and doping concentrations of the fourth doped blocks are lower than a doping concentration of the second doped region. The insulators are disposed on the third doped blocks and the fourth doped blocks of the substrate and covering portions of the fins. The dielectric strips are disposed in between the fins, in between the insulators and in between the third and fourth doped blocks. The at least one gate stack is disposed over the fins and above the insulators.

In another embodiment of the present disclosure, a fin-type field-effect transistor (FinFET) device including a substrate, insulators, a plurality of dielectric strips and gate stacks is provided. The substrate includes heavy n-doped regions, light p-doped blocks located on the heavy p-doped regions, light n-doped blocks located on the heavy n-doped regions, and fins located above the light p-doped blocks and the light n-doped blocks. The insulators are disposed on the light n-doped blocks and the light p-doped blocks, and covering portions of the fins. The plurality of dielectric strips is neighboring the light n-doped blocks, the light p-doped blocks and the fins, wherein the plurality of dielectric strips is made of high-k materials having a dielectric constant of greater than 4. The gate stacks are disposed over the fins, above the insulators and on the plurality of dielectric strips.

In yet another embodiment of the present disclosure, a method of fabricating a FinFET device is described. The method includes the following steps. A substrate is provided. A first doped region and a second doped region are formed in the substrate. A third doped region is formed over the first doped region, and a fourth doped region is formed over the second doped region, wherein the third doped region and the fourth doped region have a lower doping concentration than the first doped region and the second doped region. The substrate is patterned to form a plurality of fins. A plurality of insulators is formed on the third doped region and the fourth doped region, and on sidewalls of each of the fins. The third doped region is patterned into a plurality of third doped blocks and the fourth doped region is patterned into a plurality of fourth doped blocks using the plurality of insulators and the plurality of fins as mask. A plurality of dielectric strips is formed in between the plurality of fins and the plurality of insulators and in between the plurality of third doped blocks and the plurality of fourth doped blocks. At least one gate stack is formed over the plurality of fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first doped region and a second doped region in a substrate, wherein the second doped region is formed above the first doped region;
   patterning the substrate to form fins disposed on the second doped region;
   patterning the second doped region at areas not covered by the fins to form a plurality of second doped blocks on the first doped region;
   forming a plurality of dielectric strips on the first doped region, wherein the plurality of dielectric strips is surrounding the plurality of second doped blocks and surrounding the fins; and
   forming a gate stack over the fins and above the plurality of dielectric strips, wherein the gate stack is directly contacting the plurality of dielectric strips.

2. The method according to claim 1, further comprises:
   forming insulators on the second doped region to cover sidewalls of the fins, wherein the second doped region is patterned to form the plurality of second doped blocks using the fins and the insulators as a mask so that sidewalls of the insulators are aligned with sidewalls of the plurality of second doped blocks.

3. The method according to claim 2, further comprises removing portions of the insulator so that a height of the insulators is smaller than a height of the fins.

4. The method according to claim 2, wherein the gate stack is formed to directly contact a top surface of the insulators.

5. The method according to claim 1, wherein the first doped region is a heavy doped region, and the second doped region is a light doped region.

6. The method according to claim 1, further comprising:
   removing portions of the fins not covered by the gate stack to form recessed fin portions, and
   forming strained material portions aside the gate stack and over the recessed fin portions.

7. The method according to claim 6, wherein the strained material portions are formed to contact sidewalls of the plurality of dielectric strips, and a plurality of cavities exist in between the strained material portions and the dielectric strips.

8. A method, comprising:
   providing a substrate having a N-well region and a P-well region;
   patterning the substrate to form a first fin structure in the N-well region and a second fin structure in the P-well region, wherein the first fin structure and the second fin structure are extending in a first direction;
   forming a dielectric strip between the P-well region and the N-well region of the substrate, and extending in the first direction parallel to the first fin structure and the second fin structure;
   forming a first source/drain material on the first fin structure and a second source/drain material on the second fin structure, wherein the dielectric strip is disposed in between the first source/drain material and the second source/drain material;
   forming a plurality of insulators disposed on the N-well region and the P-well region in between the first source/drain material and the dielectric strip, and in between the second source/drain material and the dielectric strip; and
   forming a contact structure on the first source/drain material and the second source/drain material, and in direct contact with a top surface of the dielectric strip.

9. The method according to claim 8, wherein providing the substrate having the N-well region and the P-well region comprises:
   forming the P-well region in the substrate with a first doped region and a plurality of third doped blocks located above the first doped region; and
   forming the N-well region in the substrate with a second doped region and a plurality of fourth doped blocks located above the second doped region.

10. The method according to claim 9, wherein the first doped region is formed as a heavy p-doped region, the plurality of third doped blocks is formed as light p-doped blocks, the second doped region is formed as a heavy n-doped region, and the plurality of fourth doped blocks is formed as light n-doped blocks.

11. The method according to claim 9, wherein the dielectric strip is formed to be in direct contact with sidewalls of one of the plurality of third doped blocks and one of the plurality of fourth doped blocks.

12. The method according to claim 8, wherein the plurality of insulators is formed so that a height of the plurality of insulators is smaller than a height of the dielectric strip.

13. The method according to claim 8, further comprises forming an interlayer dielectric layer over the dielectric strip, the first source/drain material and the second source/drain material, and covering the contact structure.

14. A method, comprising:
   forming a plurality of fins over a plurality of doped regions, wherein the plurality of fins is extending along a first direction, and each of the plurality of fins includes a gate region and side regions located aside the gate region;
   forming a plurality of insulators covering sidewalls of the plurality of fins;
   forming a plurality of dielectric strips aside the plurality of fins and extending along the first direction, wherein an overall height of each of the plurality of dielectric strips is greater than an overall height of each of the plurality of fins in the gate region and in the side regions, and wherein the plurality of insulators is located in between the plurality of fins and the plurality of dielectric strips;
   performing a removal process to remove portions of the plurality of insulators so that a height of the plurality of insulators is reduced to be smaller than a height of the plurality of fins;
   forming a gate stack over the gate region of the plurality of fins and above the plurality of dielectric strips; and
   forming strained material portions on two sides of the gate stack over the side regions of the plurality of fins.

15. The method according to claim 14, wherein the plurality of fins is formed to be physically separated from the plurality of dielectric strips.

16. The method according to claim 14, wherein the plurality of doped regions is formed with bottom doped regions and a plurality of top doped blocks disposed on the bottom doped regions, and the plurality of fins is directly formed on the top doped blocks.

17. The method according to claim 16, wherein the plurality of fins is formed to be physically separated from the bottom doped regions.

18. The method according to claim 14, further comprises forming an interlayer dielectric layer over the gate stack and the strained material portions, wherein the interlayer dielectric layer is directly contacting a top surface of the plurality of dielectric strips.

19. The method according to claim 14, further comprises:
   performing a recessing step for recessing the plurality of fins in the side regions prior to forming the strained material portions, and without recessing the plurality of fins in the gate region, and
   forming the strained material portions on the side regions of the plurality of fins after the recessing step, wherein the overall height of each of the plurality of dielectric strips is greater than the overall height of each of the plurality of fins in the side regions prior to the recessing step, and after the recessing step.

20. The method according to claim 14, wherein after forming the strained material portions, a plurality of cavities is formed in between a bottom section of the strained material portions and the plurality of dielectric strips.

* * * * *